US012604392B2

(12) United States Patent
Thibado et al.

(10) Patent No.: US 12,604,392 B2
(45) Date of Patent: Apr. 14, 2026

(54) DIMINISHED PRINTED CIRCUIT BOARD (PCB) WARPAGE

(71) Applicant: Intel Corporation, Santa Clara, CA (US)

(72) Inventors: Jonathan W. Thibado, Beaverton, OR (US); John C. Gulick, Portland, OR (US); Emery E. Frey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1049 days.

(21) Appl. No.: 17/133,577

(22) Filed: Dec. 23, 2020

(65) Prior Publication Data

US 2021/0120663 A1    Apr. 22, 2021

(51) Int. Cl.
*H05K 1/02* (2006.01)
*H05K 7/14* (2006.01)

(52) U.S. Cl.
CPC ......... *H05K 1/0212* (2013.01); *H05K 1/0271* (2013.01); *H05K 7/1488* (2013.01)

(58) Field of Classification Search
CPC .. H05K 1/0212; H05K 1/0271; H05K 7/1488; H05K 2201/09136; H05K 2201/068
See application file for complete search history.

(56) References Cited

U.S. PATENT DOCUMENTS

| | | | | |
|---|---|---|---|---|
| 5,926,371 A | * | 7/1999 | Dolbear | H05K 1/0204 |
| | | | | 257/713 |
| 5,986,217 A | * | 11/1999 | Strum | H05K 3/3436 |
| | | | | 174/254 |
| 9,953,934 B2 | * | 4/2018 | Kumar | H01L 23/562 |
| 2017/0181271 A1 | * | 6/2017 | Yee | H05K 1/0271 |
| 2019/0103345 A1 | * | 4/2019 | Yazzie | H01L 23/49816 |
| 2019/0223324 A1 | * | 7/2019 | Le | H05K 7/20263 |

FOREIGN PATENT DOCUMENTS

CN    215222790 U    * 12/2021

* cited by examiner

*Primary Examiner* — Brian W Jennison
*Assistant Examiner* — Kristina J Babinski
(74) *Attorney, Agent, or Firm* — Hanley, Flight & Zimmerman, LLC

(57) ABSTRACT

An apparatus is described. The apparatus includes a printed circuit board (PCB), a heating element and a layer of material that is physically integrated with a surface of the PCB. The layer of material is to apply an expansive or contractive force to a surface of the PCB in response to being warmed by heat generated by the heating element. The expansive or contractive force is to cause the first surface to expand with a first coefficient of thermal expansion that is closer to a second coefficient of thermal expansion of an opposite surface of the PCB than the surface's coefficient of thermal expansion without the expansive or contractive force.

18 Claims, 11 Drawing Sheets

PCB
201

PCB
201

PACKAGED SEMICONDUCTOR CHIP

MECHANICAL
CONNECTIONS
204

HIGH CTE MATERIAL
203

HEATER TRACE
IN BOARD
202

MECHANICAL
CONNECTIONS
204

INTERNAL COPPER BEAM STRUCTURES    503

HEATER TRACES ON ADJACENT LAYER TO COPPER BEAMS    502

PCB BOARD TOP VIEW, NO COMPONENTS SHOWN

501

511

512

DIMINISHED PRINTED CIRCUIT BOARD (PCB) WARPAGE

BACKGROUND

As the performance of computing and/or networking systems continues to scale upward so does their internal operating temperatures. As such, systems designers are increasingly presented with thermal related hurdles and adapting the designs of their systems to overcome them.

FIGURES

A better understanding of the present invention can be obtained from the following detailed description in conjunction with the following drawings, in which.

DETAILED DESCRIPTION

Printed circuit boards (PCBs) are composed of multiple, alternating layers of patterned dielectric and metal. The dielectric and metal layers are patterned to have specific wiring and/or via related features, e.g., using photolithographic techniques, to effect dense interconnect wiring within the PCB. If large amounts of electrical power are consumed by the electronic devices (e.g., semiconductor chips, multi-chip modules, electro-optical modules, etc.) that are mounted to the PCB, the PCB itself can be subjected to high temperatures (e.g., 100° C. or higher).

Figure 1:
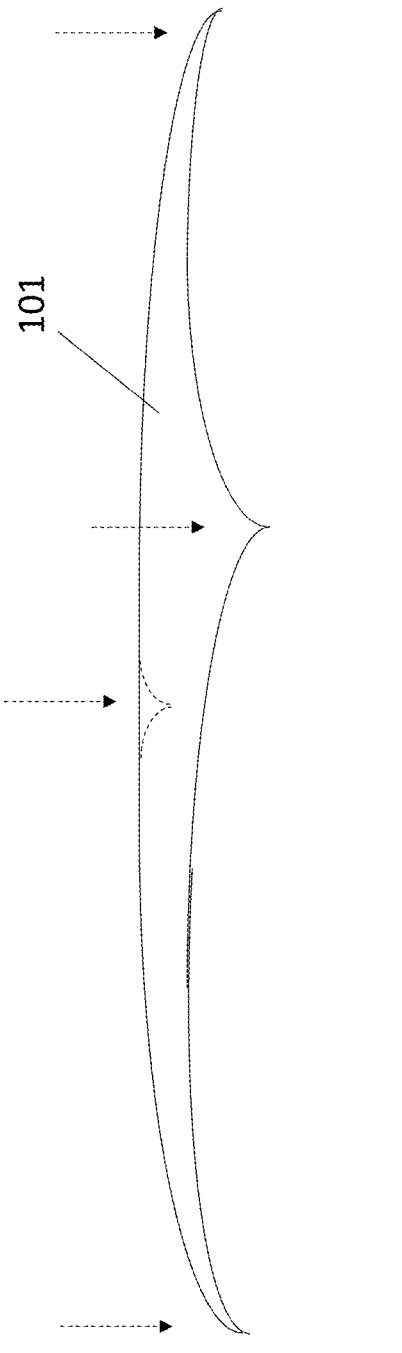
FIG. 1 shows a warped printed circuit board (PCB)

A problem, referring to FIG. 1, is that a PCB 101 will warp in response to high temperatures. Here, with the PCB 101 being composed of patterned layers of different materials having different coefficients of thermal expansion (CTE), a complex set of stresses and/or strains are established within the PCB 101 and along the PCB's surfaces. The PCB 101 will therefore warp in order to relieve the complex set of stresses and/or strains.

As described in more detail further below, the direction and shape of a PCB's warpage is largely determined by the wiring patterns within the board, the board's materials and the device that are attached to the board. For example, as observed in FIG. 1, if large metal power plane islands are placed toward the corners of the PCB 101 near the top surface of the PCB 101, the corners of the PCB 101 can "tail" down.

Here, with each power plane island being a significant metallic mass near the top surface of the PCB 101 at the corners of the PCB 101, the top surface of the PCB near the corners of the PCB 101 will exhibit greater expansion than the bottom surface of the PCB 101. Larger expansion at the corners of the PCB 101 along the top surface of the PCB 101 than the bottom surface of the PCB 101 results in the corners of the PCB 101 tailing downward in order to relieve the resultant stress.

Such warpage can present any of a number of problems. Specifically, any mechanical alignment that depends on the stability of the PCB becomes jeopardized. For example, the underside of many semiconductor package, multi-chip modules and/or electro-optic devices have input/output (I/O) arrays that are soldered to corresponding pad arrays on the PCB surface. Warpage by the PCB can stress the I/O solder joints to the point of irreversible damage (e.g., the surface of the PCB pulls away from the I/O array).

As another example, optical communication links are finding increased adoption/application within high performance computing environments such as data center environments. Here, e.g., fiber optic links are run between computer servers (and/or between servers and network routers). The fiber optic links can terminate directly on the motherboard of servers or other computing systems.

A fiber optic link is typically composed of a laser or light emitting diode (LED) on the transmitting end and a photodiode (PD) at the receiving end. Each laser/LED/PD is coupled to the end of a fiber optic cable having a small diameter (e.g., glass) core. Here, light from a laser or LED is launched into the core, or, light from the core is received by the PD. Given the small diameter of the core, the core and the corresponding optical device are precisely aligned with one another. Warpage of the PCB can ruin the alignment, which, in turn, causes the optic link to fail.

Again, it is pertinent to point out that PCB board warpage is generally particular to the electrical wiring patterns within the board, the materials used for the metal and dielectric layers and the size and location of the different devices that are attached to the board (e.g., heat sinks, cold plates, large multi-chip modules, etc.). As such, different PCB boards can warp in different ways (e.g., convex, concave, corner tailing, etc.). Generally, however, warpage results when one of the surfaces (upper or lower) expands more than the other of the surfaces with the higher expanding surface bowing out and the lesser expanding surface bowing in.

Once designed and/or constructed, a PCB's unique warpage can be characterized. Once a particular PCB's warpage is characterized, FIG. 2 shows a modest design modification that can be introduced to the PCB to compensate for its specific warpage profile.

Figure 2:
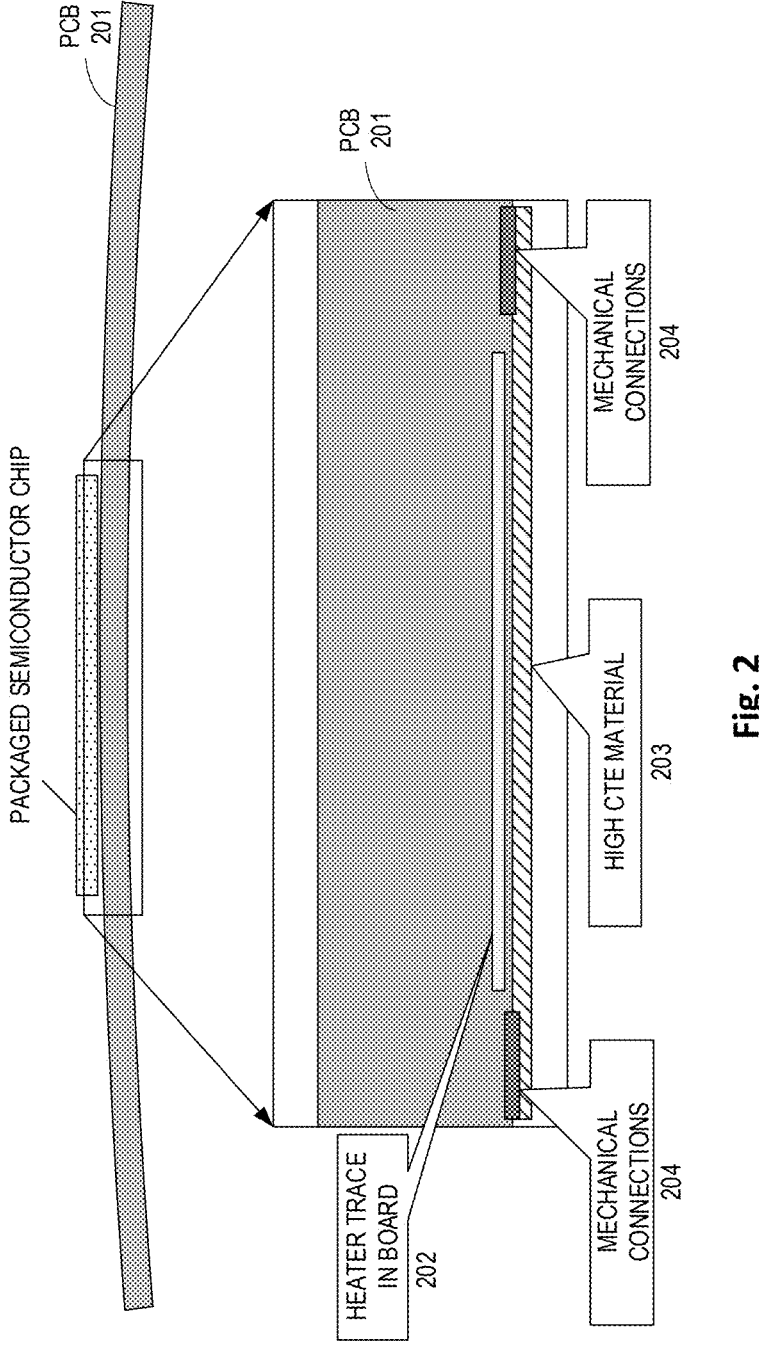
FIG. 2 shows a first embodiment of a structure to reduce PCB warpage.

As observed in FIG. 2, a heating element 202 and higher CTE material 203 are placed along or near the lesser expanding surface of the PCB 201. The higher CTE material 203 has a higher CTE than the particular PCB surface it is placed at/near (the lesser expanding surface of the PCB that bows in). In the particular approach of FIG. 2, the higher CTE material 203 is a layer of material (e.g., a planar structure) that is placed on the lesser expanding surface and is anchored to the PCB by way of mechanical connections 204 (e.g., screws, bolts, soldered joints, etc.).

For example, the higher CTE material can be a metal plate that is screwed, bolted or soldered to the PCB. This particular solution might be particularly useful if, e.g., the lesser expanding surface is the underside of the PCB and the PCB has few/no electrical components mounted to its underside.

The heating element 202 in the particular approach of FIG. 2 is observed to be a resistive element that is embedded in the multilayer PCB 201. Here, for instance, the resistive element may be a wire that is designed into the PCB having a specific cross sectional area and length that determines the wire's overall resistance. When current is run through the resistive element 202, it generates heat which warms the higher CTE material 203. The higher CTE material 203 then expands in response to the heat from the heating element 202.

Importantly, with the higher CTE material 203 being mechanically anchored to the PCB 201 along the PCB's bottom surface, its expansion essentially applies an additional expansion force to the lesser expanding surface of the PCB. With the lesser expanding surface of the PCB receiving an additional expansion force, it expands more than it would have if the heating element 202 and higher CTE material 203 were not present. With the additional expansion, the difference in expansion between the higher (upper) and lesser (lower) expanding surfaces of the PCB is reduced, which, in turn, results in less PCB warpage.

In various embodiments, the difference in expansion between the PCB surfaces is made to be negligible to the point were little/no PCB warpage exists. That is, both PCB surfaces expand approximately the same amount resulting in no bowing of the PCB.

Figures 3A, 3B, 3C:
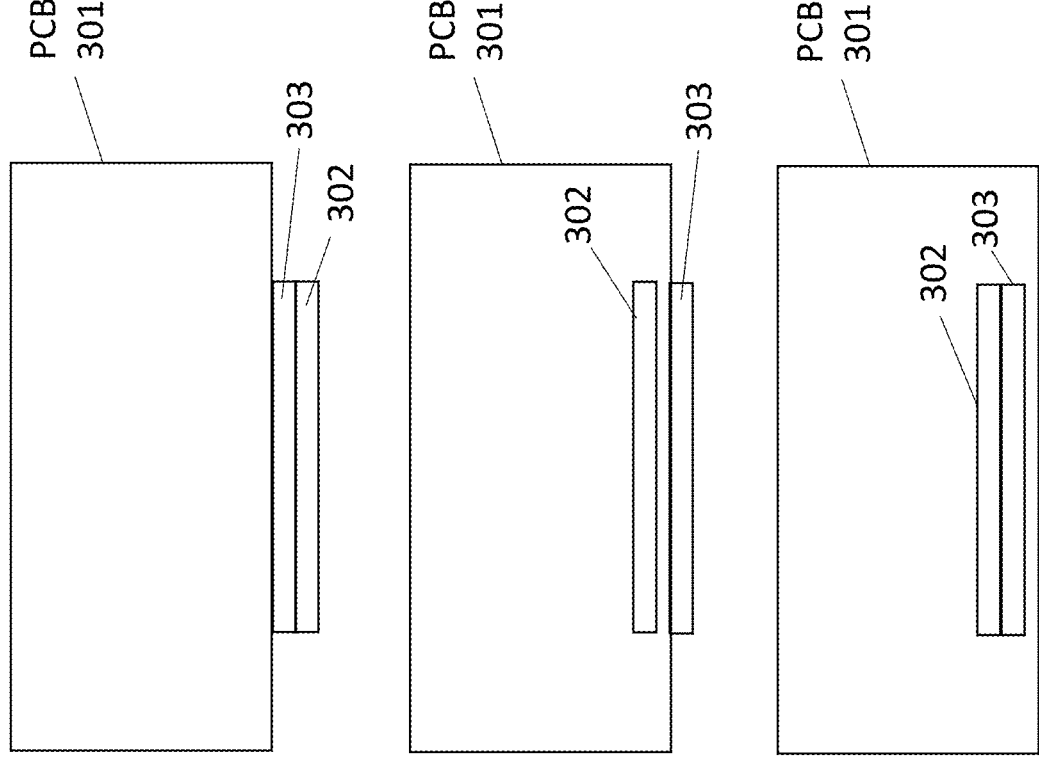
FIGS. 3a, 3b and 3c show respective structures of additional embodiments to reduce PCB warpage.

FIG. 2 shows a particular embodiment where the higher CTE material 203 is located outside the PCB 201 and the heating element 202 is located inside the PCB. FIGS. 3*a*, 3*b* and 3*c* depict alternate approaches. Specifically, FIG. 3*a* shows an approach where both the heating element 302 and higher CTE material 303 are located outside the PCB 301. By contrast, FIG. 3*b* shows an approach where the heating element 302 is located outside the PCB and the higher CTE material 303 is located inside the PCB. FIG. 3*c* shows another approach where both the heating element 302 and the higher CTE material 303 are located inside in the PCB. For embodiments where the higher CTE material 303 is located inside the PCB 301, the higher CTE material 303 can be embodied, e.g., as a planar layer of metal along one of the wiring/metal layers of the PCB (e.g., akin to a power plane, or, as an actual power plane).

Figure 4A:
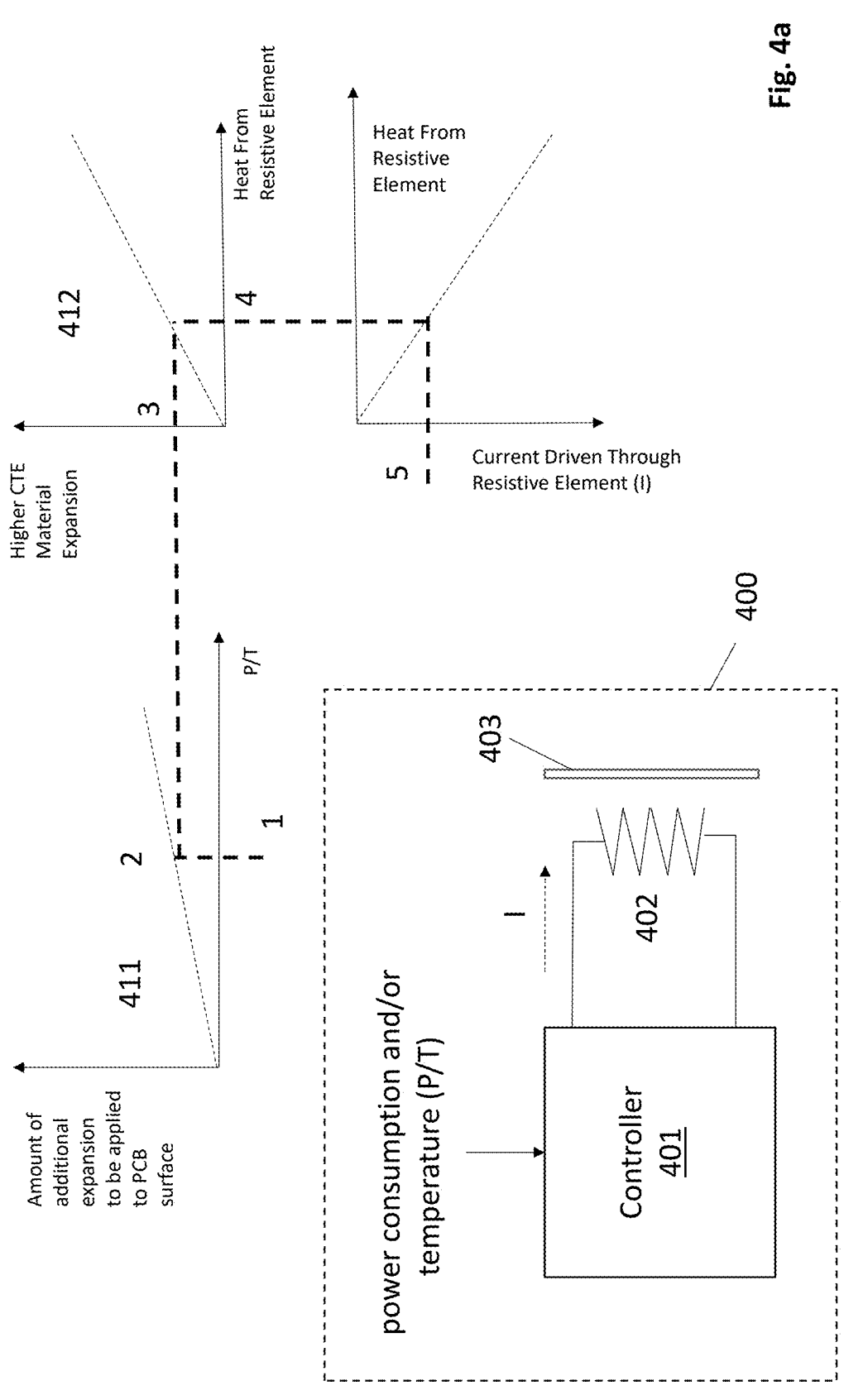
FIG. 4a shows a first method and corresponding circuit for reducing PCB warpage.

FIG. 4*a* shows a first circuit 400 and method that can be executed by the circuit to control the amount of additional expansion that is to be applied to the lesser expanding PCB surface by the higher CTE material 403. The circuit 400 can be implemented on the PCB itself.

Here, recall that different PCBs will generally exhibit their own unique warpage profiles as a function of each PCB's specific wiring/metal patterns, materials and devices that are mounted to the PCB. Because different PCBs are generally different in any/all of these respects, different PCBs will tend to exhibit their own unique warpage profiles.

A warpage profile 411 for a particular PCB characterizes not only where bowing occurs but also how much bowing occurs as a function of, e.g., ambient temperature and/or power consumption by the devices on the PCB. Generally, bowing increases with increasing temperature/power but how much bowing will occur as a function of temperature/power is specific to a particular PCB.

Once a particular PCB's warpage is characterized 411 as a function of temperature/power, the amount of additional expansion 2 to be experienced by the PCB's lesser expanding surface, for a particular pressure/temperature 1, in response to the forces applied by the higher CTE material 403 can be defined. With the amount of additional expansion 2 being defined, the amount of expansion to be exhibited by the higher CTE material 3 can be defined. Here, there can be some inefficiency between the expansion of the higher CTE material and the lesser expanding PCB surface. That is, the higher CTE material 403 may expand more than the lesser expanding PCB surface (e.g., because the PCB provides some resistance against the expansive force applied by the higher CTE material).

Nevertheless, those of ordinary skill will be able to sufficiently characterize the interface between the higher CTE material 403 and the lesser expanding PCB surface so that a desired amount of lesser PCB surface expansion 2 can be correlated back to a specific amount of higher CTE material expansion 3. Then, with the specific amount of CTE material expansion 3 being defined as a function of power/temperature, the amount of heat 4 to be generated by the heating element 402 can be defined as a function of power/temperature.

Here, again, some inefficiency may exist between the temperature of the heating element 402 and the temperature of the higher CTE material 403 (the temperature of the higher CTE material 403 might be less than the temperature of the heating element 402). However, those of ordinary skill will be able to sufficiently characterize the inefficiency so that, e.g., a precise heating element temperature 4 can be correlated 3 to a precise amount of total expansion 2 experienced by the lesser expanding PCB surface as function of power/temperature 1.

With this correlation being determined, the specific amount of current 5 to be driven through the heating element 402 to induce the desired amount of expansion 2 in the lesser expanding PCB surface for any power/temperature 1 can be defined. A controller 401 therefore receives information that describes the PCB board's power consumption and/or ambient temperature, and, from the aforementioned correlation, determines the appropriate amount of current to drive through the heating element 402. If power consumption is an input parameter, there may be multiple and/or weighted power consumption components that affect the overall warpage profile and corresponding expansion (e.g., power consumption is considered for each of multiple high performance devices on the PCB). In various embodiments, the amount of applied current increases with increasing power/temperature and diminishes (if not eliminates) PCB warpage over a range of powers and/or temperatures.

Figure 4B:
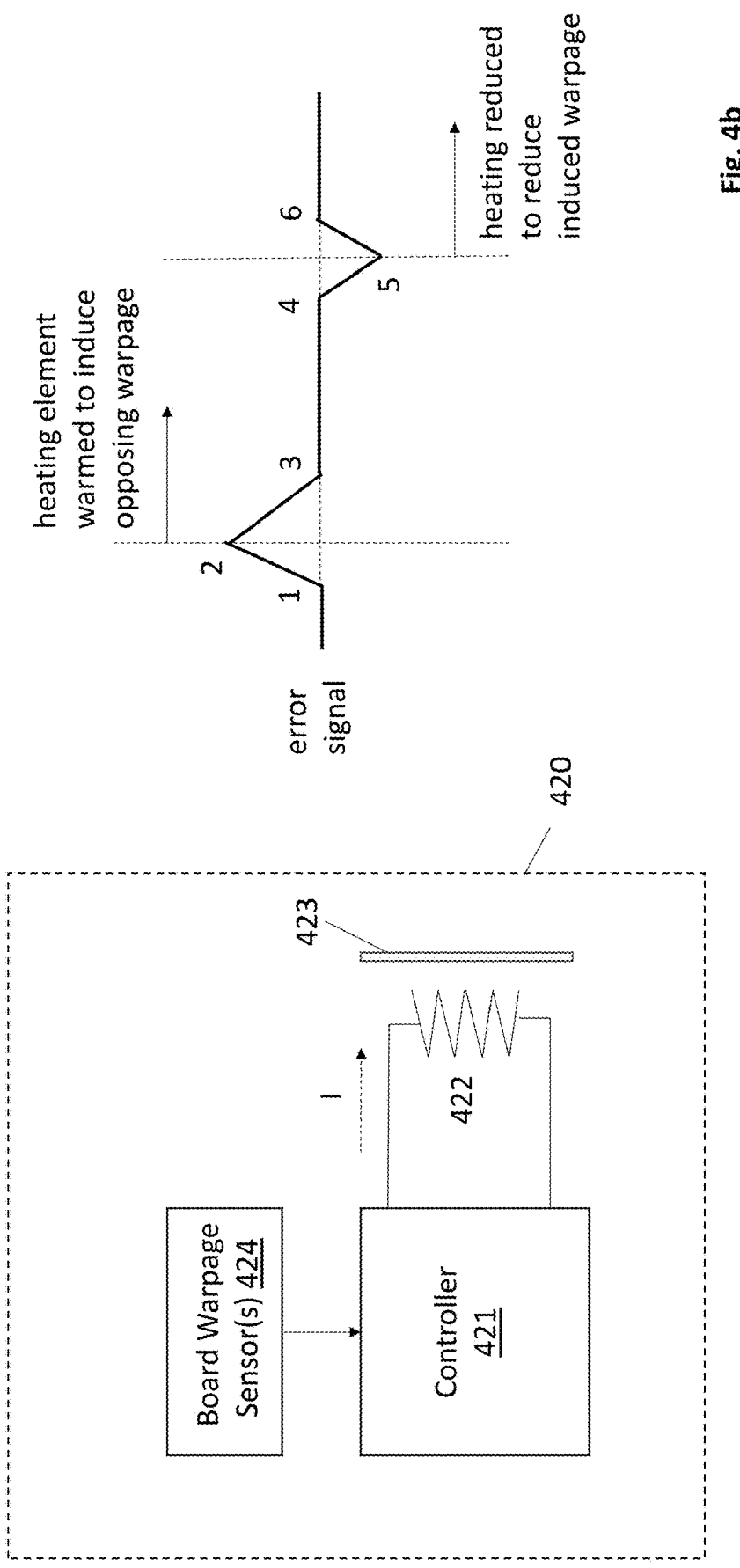
FIG. 4b shows a second method and corresponding circuitry for reducing PCB warpage.

Whereas the circuit and method of FIG. 4*a* are directed to controlling board warpage by applying correlations that are established, e.g., pre-runtime, by contrast, FIG. 4*b* pertains to another circuit and method that measures board warpage in real time, and, e.g., through a control feedback loop, modulates the temperature of one or more heating elements to induce an opposing warpage that offsets the detected warpage (resulting in little/no overall board warpage).

As is understood in the art, a feedback control loop is designed to process (e.g., integrate) an error signal that reflects the state of a system. When the system is in a desired state, the error signal maintains a specific value (e.g., zero). If the system diverges from the desired state, the error signal deviates from the specific value. The polarity and magnitude of the error signal informs the controlling hardware of the magnitude and polarity of the corrective action. As the hardware applies the correction action, the error signal is driven back to the specific value which indicates the system has returned to its desired state.

In the case of using feedback to control board warpage, one or more board warpage sensors 424 (e.g., optical sensors, strain gauges, etc.) are dispersed along the PCB. The output of the warpage sensors 424 essentially correspond to the error signal. That is, when the PCB is not warping, the sensors are not generating an appreciative signal which corresponds to a zero error signal. If, e.g., the electronics on the PCB suddenly begin to draw a large amount of power and dissipate large amounts of heat, the sensors will detect board warpage 1.

Here, the amplitude of the error signal indicates how much warpage exists and the polarity of the warpage. For the sake of example, assume that the positive polarity in the error signal at point 2 in FIG. 4b indicates that the top surface of the PCB is warping in a convex direction. The controller 421 observes the error signal and recognizes that it should apply an opposing concave strain. As such, the controller 421 enables a heating element 422 that warms a high CTE material 423 on the backside of the PCB to apply the opposing strain.

As the high CTE material 423 expands it reduces the overall board warpage and, ultimately, the error signal is driven 3 to the desired value when the heated CTE material 423 offsets the PCB's natural warpage resulting in little/no overall board warpage. The control system will then maintain this state with the high CTE material 423 being warmed and the PCB's electronics drawing large amounts of current and dissipating large amounts of heat.

If the electronics suddenly stop drawing large amounts of current and dissipating large amounts of heat, the PCB will begin to exhibit concave warpage on its top surface because the PCB will not exhibit little/any natural warpage yet the heating element 422 is still being driven to expand the high CTE material 423 (the high CTE material 423 is now warping the top of the board in a concave direction).

The sensors 424, however, will detect the warpage and generate an error signal 5 whose polarity represents concave warpage. The controller 421 observes the error signal 5 and reduces the heat in response (reduction of heat corresponds to applying an opposing convex strain). As such, the warpage in the PCB will reduce and the error signal will be driven toward its desired value. When the error signal reaches the desired value 6 there is no warpage and the heat is removed from the heating element 422.

Figure 5:
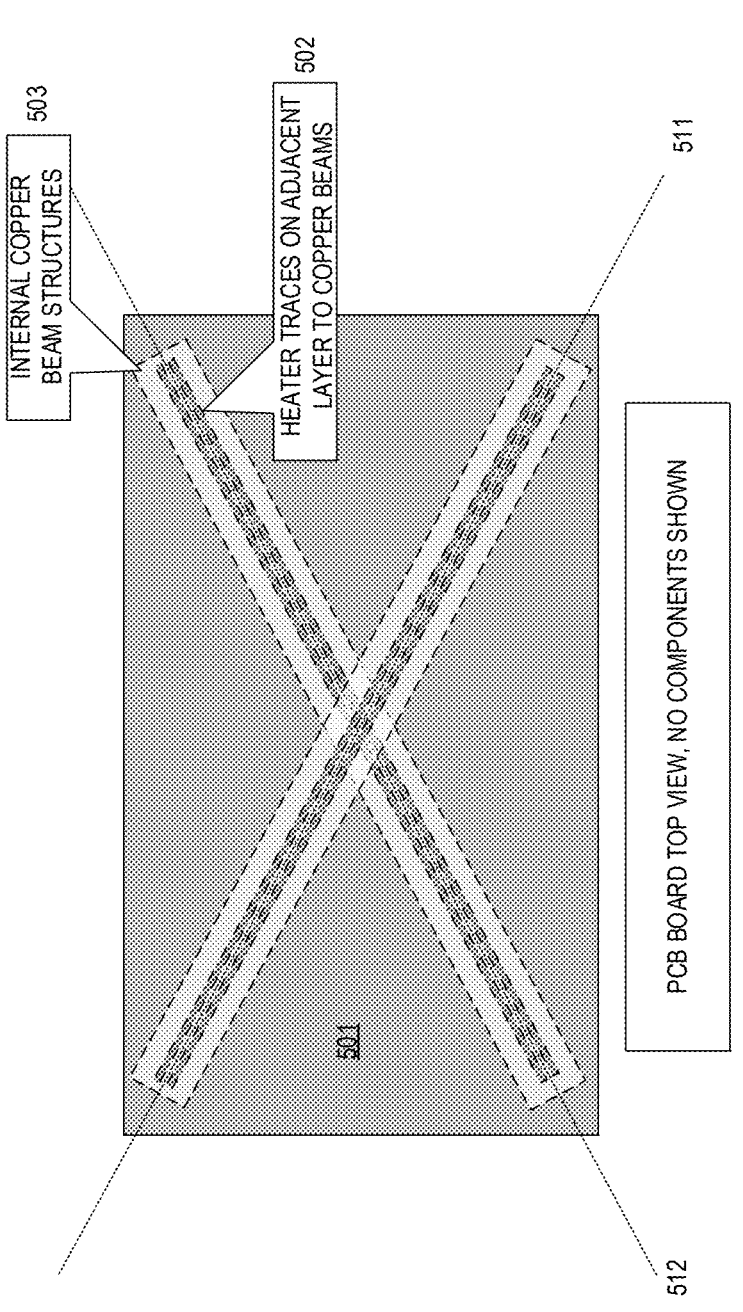
FIG. 5 shows an embodiment of a heating element and a layer of material to apply a PCB warpage reducing force to a surface of the PCB.

FIG. 5 illustrates that the size and shape of the higher CTE material 502 and/or heating element 503 can be customized to address the PCB's particular warpage profile. Here, the shape and size of the heating element 502 and/or higher CTE material 503 can be designed to apply expansive forces to the lesser expanding PCB surface in the region(s) and/or direction(s) where adding some additional expansion to the lesser expanding PCB surface will best offset the expansion of the greater expanding PCB surface that causes the PCB's warpage.

The shape and size of the heating element 502 and higher CTE material 503 observed in FIG. 5 corresponds to the particular warpage profile observed in FIG. 1. The corner tailing observed in FIG. 1 generally results from the higher expanding surface of the PCB expanding more than the lesser expanding surface in outward directions along axes 511, 512 in FIG. 5. By inducing the lesser expanding surface of the PCB 501 to expand more in an outward direction along these same axes 511, 512, the heating element 502 and higher CTE material 503 will have a greater impact reducing or nullifying the PCB board warpage. As such, the shape and size of the heating element 502 and higher CTE material 503 observed in FIG. 5, by being placed along these axes 511, 512, are designed to impart more outward expansion along them. Note that the particular PCB embodiment of FIG. 5 corresponds to the approach of FIG. 3c where both the heating element 302 and higher CTE material 503 are embedded in the PCB 301.

Figure 6:
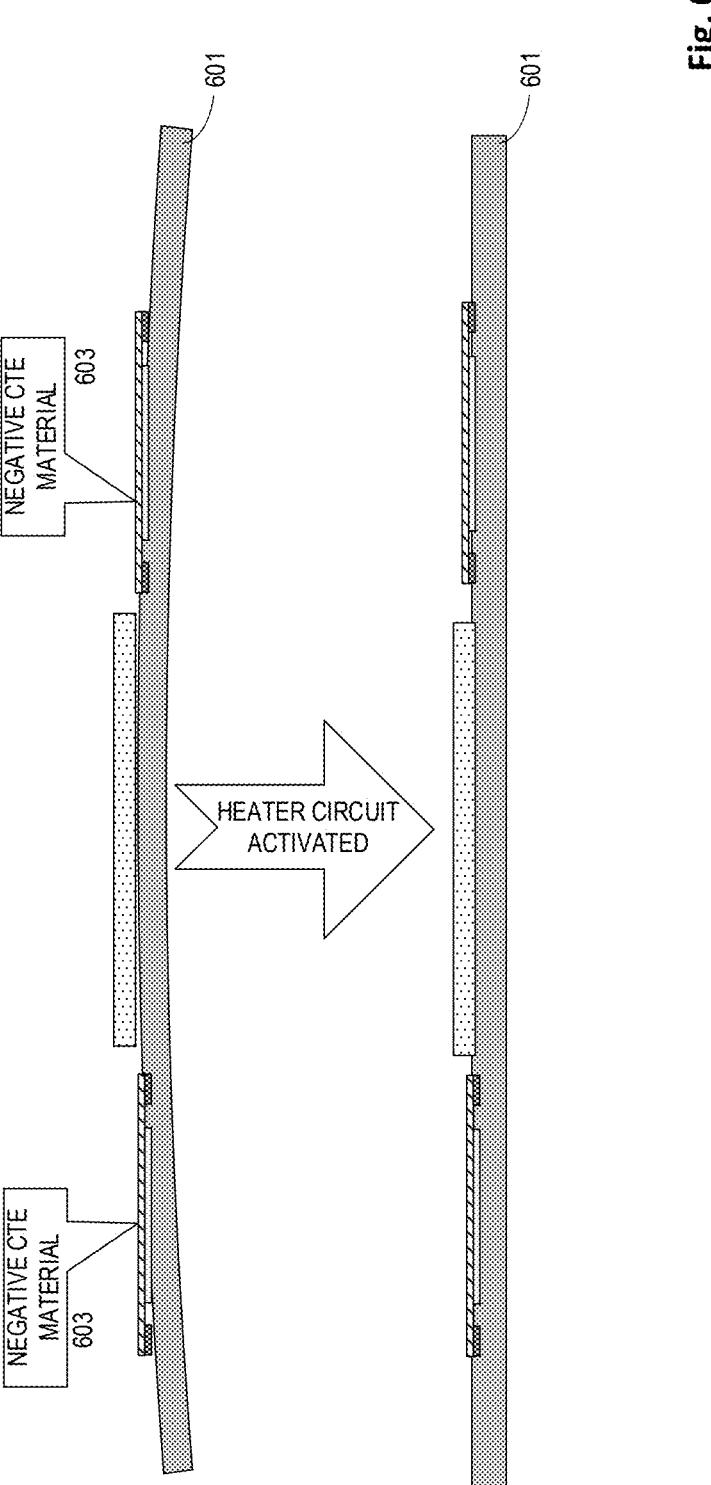
FIG. 6 shows another embodiment of a structure to reduce PCB warpage.

FIG. 6 shows another approach in which a material having negative CTE 603 is applied to the higher expanding surface of the PCB 601. That is, whereas the aforementioned described approaches attempt to impart additional expansion to the lesser expanding PCB surface with a material that expands with increasing temperature (positive CTE), by contrast, the approach of FIG. 6 attempts to resist the expansion of the higher expanding PCB surface with a material 603 that contracts with increasing temperature (negative CTE).

Here, be applying a resistive force to the higher expanding PCB surface (which is the upper PCB surface in the example of FIG. 6), the higher expanding PCB surface will expand less that it otherwise would if the negative CTE material were not present. As such, the difference in expansion between the higher and lesser expanding PCB surfaces is reduced which results in less warpage. In ideal situations, the difference can be largely nullified resulting in little/no warpage of the PCB 601.

Similar to the discussion of FIGS. 3a,b,c, with respect the negative CTE approach of FIG. 6, the negative CTE material and heating element can be located in the vicinity of the higher expanding surface outside the higher expanding PCB surface or inside the PCB board. Also, similar to the discussion of FIG. 4, those of ordinary skill will be able to determine the appropriate correlation(s) so that the heating element is driven by a circuit like the circuit 400 in FIG. 4 with an appropriate amount of current to generate an appropriate amount of heat to apply a desired amount of resistance for a particular PCB power consumption and/or temperature.

Figure 7:
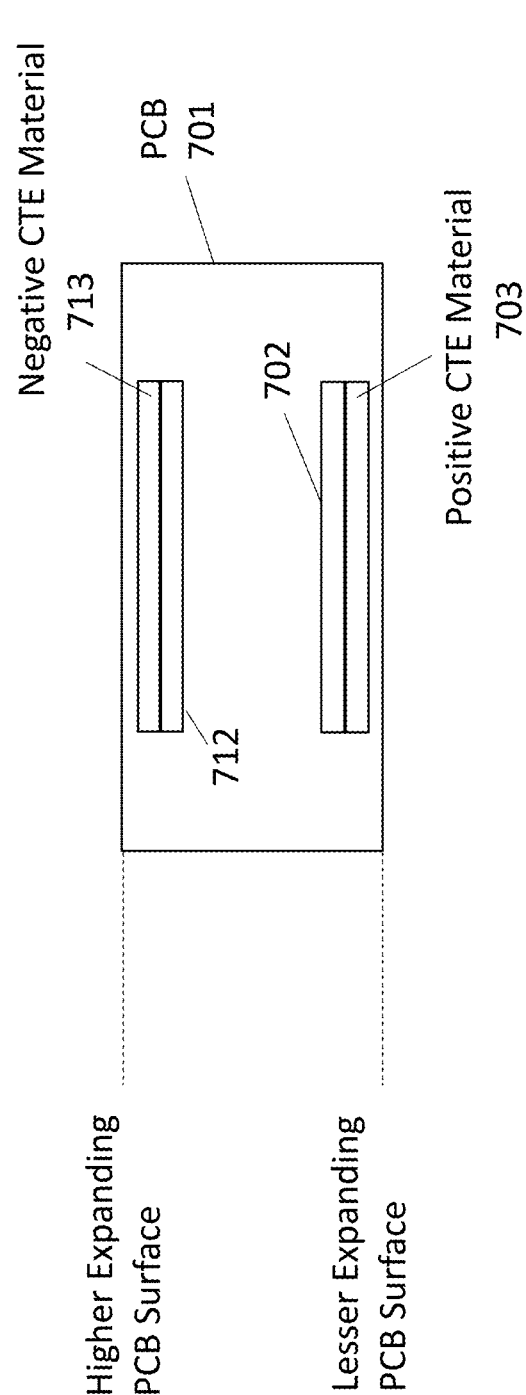
FIG. 7 shows another embodiment of a structure to reduce PCB warpage.

The approach of FIG. 6 can be applied by itself or in combination with a higher CTE material and heating element as described above with respect to FIG. 2 and FIGS. 3a-c. In this case, as observed in FIG. 7, resistance is applied to the expansion of the higher expanding PCB surface (with a negative CTE material 713) concurrently with the application of an expansive force to the lesser expanding PCB (with a positive CTE material 712). Concurrently employing both techniques can diminish or nullify PCB warpage when there is a large CTE mismatch between the upper and lower surfaces of the PCB 701.

Various materials are known to exhibit negative CTE ("NTE"). Examples include zirconium tungstate ($ZrW_2O_8$), members of the $AM_2O_8$ family of materials (where A=Zr or Hf, M=Mo or W) and $HfV_2O_7$ and $ZrV_2O_7$, although $HfV_2O_7$ and $ZrV_2O_7$ only exhibit negative CTE at higher temperatures (350 to 400 K)). $A_2(MO_4)_3$ is an example of controllable negative thermal expansion. Cubic materials like $ZrW_2O_8$ and also $HfV_2O_7$ and $ZrV_2O_7$ exhibit isotropic NTE. Titanium-based alloys (e.g., ALLVAR) exhibit NTE over a wide temperature range. Carbon fibers show NTE between 20° C. and 500° C. Quartz ($SiO_2$) and a number of zeolites also show NTE over certain temperature ranges. Fairly pure silicon (Si) has a negative coefficient of thermal expansion for temperatures between about 18 K and 120 K. Cubic Scandium trifluoride also exhibits negative CTE. ScF and shape memory alloys such as NiTi are a nascent class of materials that exhibit zero and negative thermal expansion. Thus, the negative CTE material can be implemented with any of these (or other) materials.

It is pertinent to point out that a PCB board having any of a number of different high performance semiconductor chips could exhibit warpage (and therefore make use of the teachings herein) because of the power consumption of the semiconductor chips and/or loading and/or thermal mismatches caused by their associated packaging.

Although embodiments above have emphasized applying heat to counteract PCB warpage, in still yet other embodiments, a peltier device or other, e.g., electronic cooling device that can controllably chill a region it is placed in contact with, is used to chill the more expansive side of the PCB to prevent, minimize or otherwise counteract the PCB's natural warpage. The control mechanism can be any of those described above with the difference being that the control signal (voltage and/or current) that is sent to the device is intended to increasingly cool/chill the device and PCB in response to increasing PCB warpage.

Examples include processors (CPUs), (e.g., system-on-chip, accelerator chip (e.g., neural network processor), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.).

A PCB board that makes use of the teachings herein can be integrated into a chassis having dimensions that are compatible with an industry standard rack (such as racks having 19" or 23" widthwise openings and having mounting holes for chassis having heights of specific height units (e.g., 1U, 2U, 3U where U=1.75"). One example is the IEC 60297 Mechanical structures for electronic equipment—Dimensions of mechanical structures of the 482.6 mm (19 in) series. Generally, however, a chassis of any dimension is possible.

The electrical I/Os of the chip package to motherboard connections described above may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

A PCB board that makes use of the teachings provided above, and/or the PCB board's associated electronic system, may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 8:
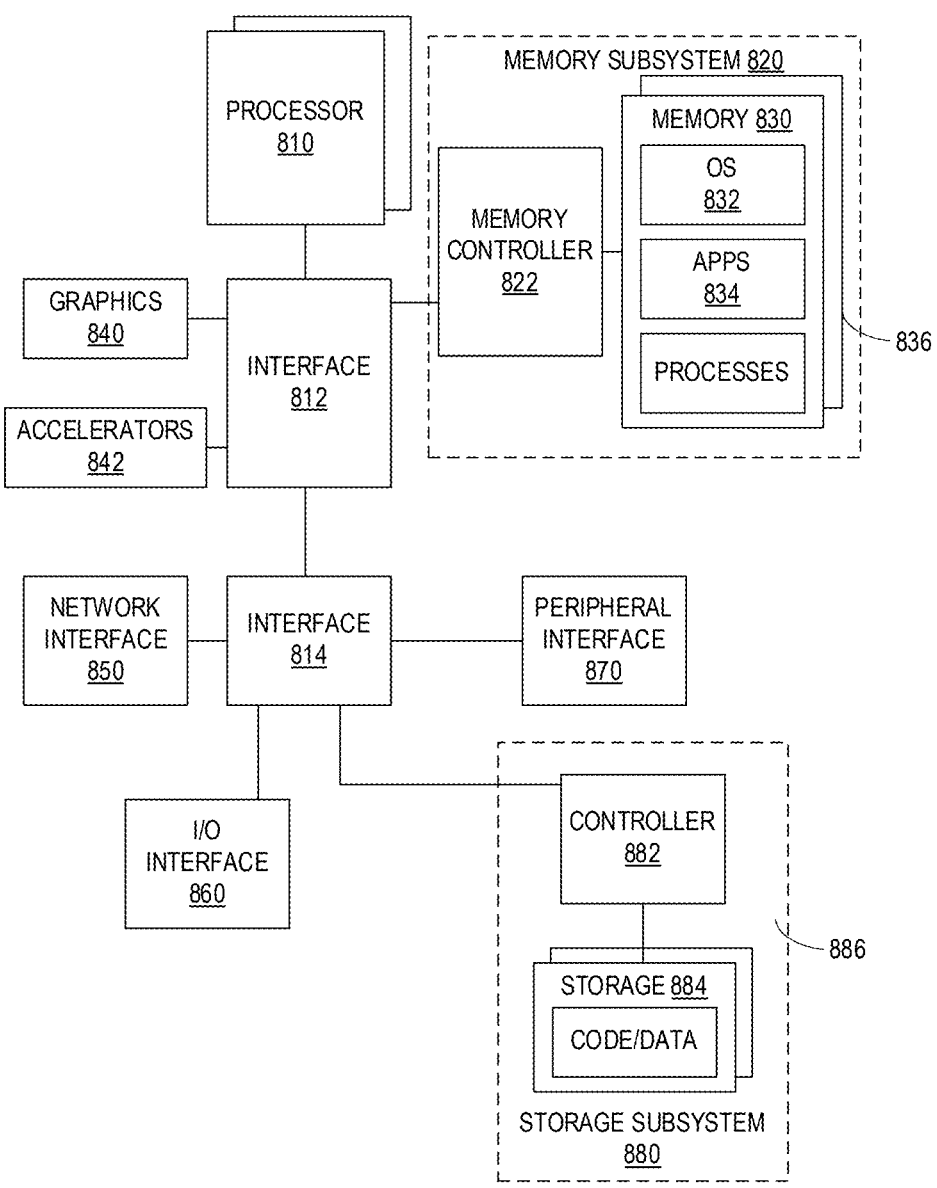
FIG. 8 shows a computing system.

FIG. 8 depicts an example system. The system can use embodiments described herein to determine a reference voltage to apply to a rank of memory devices and a timing delay of a chip select (CS) signal sent to the rank of memory devices. System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a fixed function offload engine that can be accessed or used by a processor 810. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 842 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, volatile memory, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 800 includes interface 814, which can be coupled to interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a remote device, which can include sending data stored in memory. Network interface 850 can receive data from a remote device, which can include storing received data into memory. Various embodiments can be used in connection with network interface 850, processor 810, and memory subsystem 820.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (e.g., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (e.g., the value or state of the data is indeterminate if power is interrupted to system 800). In one example, storage subsystem 880 includes controller 882 to interface with storage 884. In one example controller 882 is a physical part of interface 814 or processor 810 or can include circuits or logic in both processor 810 and interface 814.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 800. More specifically, power source typically interfaces to one or multiple power supplies in system 1000 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 9:
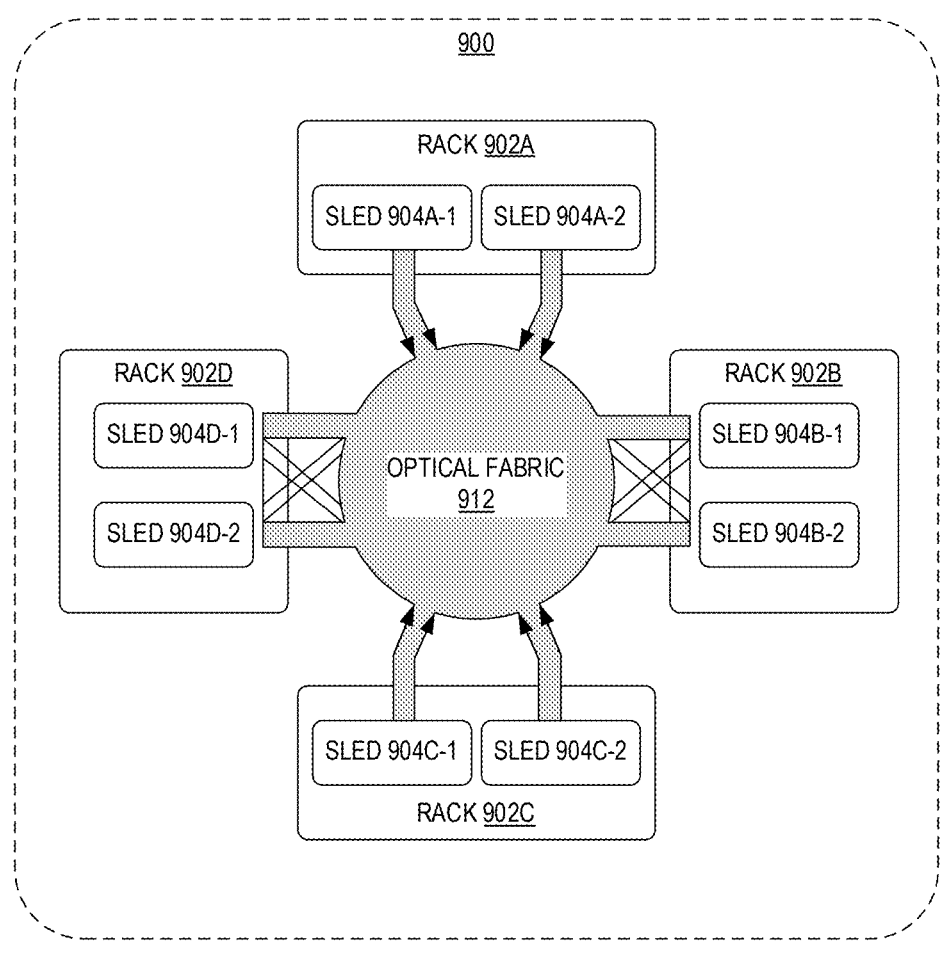
FIG. 9 shows a data center.

FIG. 9 depicts an example of a data center. Various embodiments can be used in or with the data center of FIG. 9. As shown in FIG. 9, data center 900 may include an optical fabric 912. Optical fabric 912 may generally include a combination of optical signaling media (such as optical cabling) and optical switching infrastructure via which any particular sled in data center 900 can send signals to (and receive signals from) the other sleds in data center 900. However, optical, wireless, and/or electrical signals can be transmitted using fabric 912. The signaling connectivity that optical fabric 912 provides to any given sled may include connectivity both to other sleds in a same rack and sleds in other racks. Data center 900 includes four racks 902A to 902D and racks 902A to 902D house respective pairs of sleds 904A-1 and 904A-2, 904B-1 and 904B-2, 904C-1 and 904C-2, and 904D-1 and 904D-2. Thus, in this example, data center 900 includes a total of eight sleds. Optical fabric 912 can provide sled signaling connectivity with one or more of the seven other sleds. For example, via optical fabric 912, sled 904A-1 in rack 902A may possess signaling connectivity with sled 904A-2 in rack 902A, as well as the six other sleds 904B-1, 904B-2, 904C-1, 904C-2, 904D-1, and 904D-2 that are distributed among the other racks 902B, 902C, and 902D of data center 900. The embodiments are not limited to this example. For example, fabric 912 can provide optical and/or electrical signaling.

Figure 10:
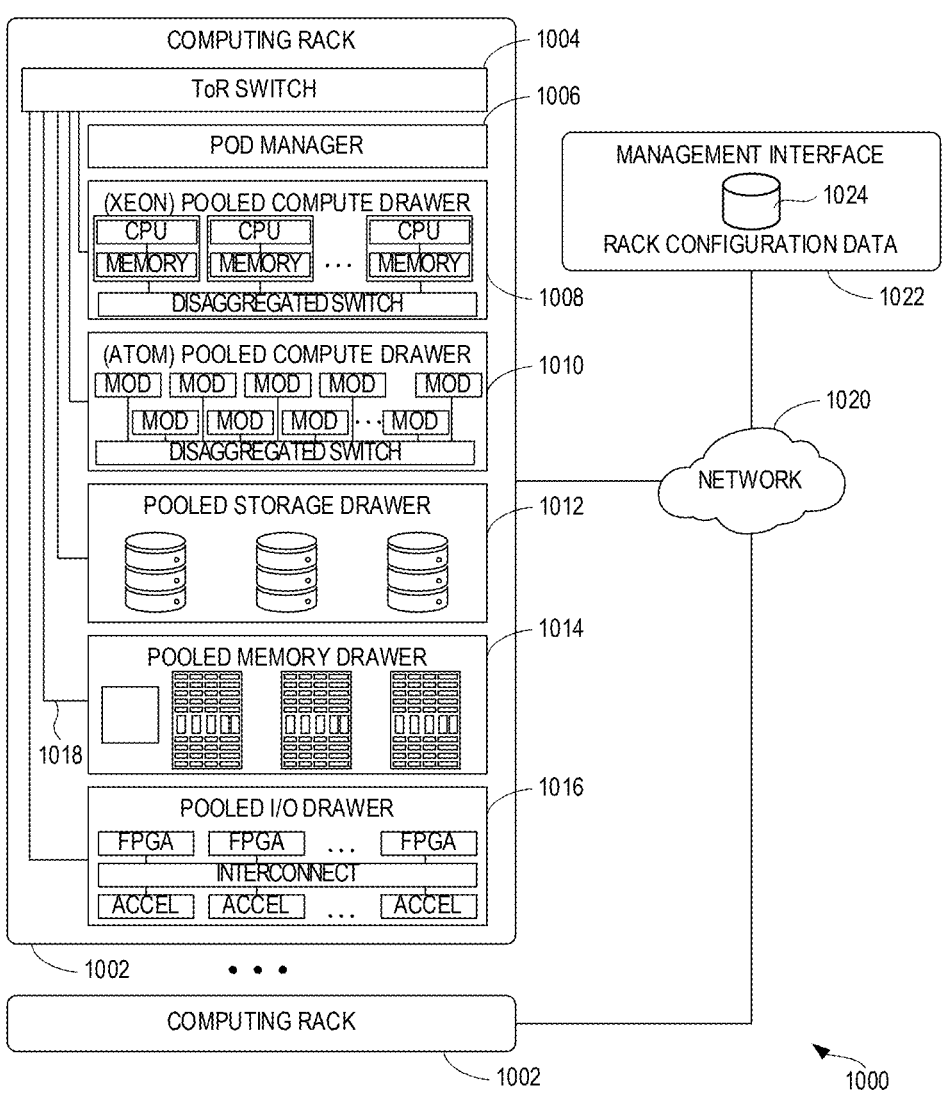
FIG. 10 shows multiple racks.

FIG. 10 depicts an environment 1000 includes multiple computing racks 1002, each including a Top of Rack (ToR) switch 1004, a pod manager 1006, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1008, and INTEL® ATOM™ pooled compute drawer 210, a pooled storage drawer 212, a pooled memory drawer 214, and an pooled I/O drawer 1016. Each of the pooled system drawers is connected to ToR switch 1004 via a high-speed link 1018, such as a 40 Gigabit/second (Gb/s) or 100 Gb/s Ethernet link or an 100+Gb/s Silicon Photonics (SiPh) optical link. In one embodiment high-speed link 1018 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1000 may be interconnected via their ToR switches 1004 (e.g., to a pod-level switch or data center switch), as illustrated by connections to a network 1020. In some embodiments, groups of computing racks 1002 are managed as separate pods via pod manager(s) 1006. In one embodiment, a single pod manager is used to manage all of the racks in the pod. Alternatively, distributed pod managers may be used for pod management operations.

RSD environment 1000 further includes a management interface 1022 that is used to manage various aspects of the RSD environment. This includes managing rack configuration, with corresponding parameters stored as rack configuration data 1024.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
   a printed circuit board (PCB) having a first surface opposite a second surface;
   a plate coupled to the first surface of the PCB, the plate having a first coefficient of thermal expansion that is different than a second coefficient of thermal expansion of the first surface of the PCB;

a fastener to couple the plate and the first surface of the PCB; and a heating element associated with the plate, the heating element selectively operable to induce a thermal characteristic of the plate to at least one of prevent or restrict the PCB from bowing.

2. The apparatus of claim 1, wherein the heating element is located within the PCB.

3. The apparatus of claim 1, wherein the plate is in direct contact with the PCB.

4. The apparatus of claim 1, wherein the heating element is located outside the PCB.

5. The apparatus of claim 1, wherein the plate is to apply an expansive force to the first surface of the PCB in response to heat generated by the heating element, and the first coefficient of thermal expansion of the plate is greater than a third coefficient of thermal expansion of the second surface of the PCB.

6. The apparatus of claim 1, wherein the plate is a planar structure composed of metal.

7. The apparatus of claim 1, wherein the plate is to apply a contractive force, and the first coefficient of thermal expansion of the plate is less than a third coefficient of thermal expansion of the second surface of the PCB.

8. The apparatus of claim 1, further including a controller coupled to the PCB to drive the heating element with current to generate the heat.

9. An apparatus comprising:

a circuit board having a first surface opposite a second surface;

a heating element; and a metal anti-warping structure coupled to the circuit board, the metal anti-warping structure having coefficient of thermal expansion values to at least one of expand or contract at a different rate than at least one of the first surface or the second surface of the circuit board to apply at least one of an expansive or contractive force to the circuit board in response to being warmed by heat generated by the heating element, the at least one of the expansive or contractive force to at least one of prevent or restrict the circuit board from bowing, the anti-warping structure includes a first metal beam and a second metal beam, the first metal beam extends diagonally between opposing first corners of the circuit board, and the second metal beam extends diagonally between opposing second corners of the circuit board.

10. The apparatus of claim 9, wherein the metal anti-warping structure is embedded in the circuit board.

11. The apparatus of claim 9, wherein the heating element includes a first heating element positioned along a length of the first metal beam and a second heating element positioned along a length of the second metal beam.

12. An apparatus comprising:

a printed circuit board (PCB) having a first surface opposite a second surface, the first surface having a first coefficient of thermal expansion and the second surface having a second coefficient of thermal expansion, the first coefficient of thermal expansion greater than the second coefficient of thermal expansion; and a first anti-warping structure adjacent to the first surface of the PCB, the first anti-warping structure having a third coefficient of thermal expansion that is less than the first coefficient of thermal expansion, the first anti-warping structure including a first heating element, the first heating element selectively operable to generate heat to influence thermal characteristics of the first anti-warping structure such that the first anti-warping structure is to apply a contractive force to the first surface of the PCB in response to being warmed by heat generated by the first heating element, the contractive force to at least one of prevent or restrict the first surface of the PCB from bowing.

13. The apparatus of claim 12, further including:

a second heating element; and a second anti-warping structure adjacent to the second surface of the PCB, the second anti-warping structure having a fourth coefficient of thermal expansion that is greater than the second coefficient of thermal expansion of the second surface of the PCB, the second anti-warping structure to apply an expansive force to the second surface of the PCB in response to being warmed by heat generated by the second heating element, the expansive force to at least one of prevent or restrict the second surface of the PCB from bowing.

14. The apparatus of claim 13, wherein the first anti-warping structure and the second anti-warping structure are embedded in the PCB.

15. The apparatus of claim 13, wherein the second anti-warping structure is to apply a force on the second surface of the PCB in a direction that is opposite to a force applied by the first anti-warping structure to the first surface of the PCB.

16. The apparatus of claim 1, wherein the plate is coupled directly to an exterior surface of the circuit board.

17. The apparatus of claim 12, wherein the first anti-warping structure includes a first metal beam, the first metal beam extends diagonally between opposing first corners of the circuit board.

18. The apparatus of claim 17, wherein the heating element includes a first heating element positioned along a length of the first metal beam.

* * * * *